(12) United States Patent
Kim et al.

(10) Patent No.: US 11,751,429 B2
(45) Date of Patent: Sep. 5, 2023

(54) DISPLAY DEVICE

(71) Applicant: Samsung Display Co., Ltd., Yongin-si (KR)

(72) Inventors: Jun Gi Kim, Hwaseong-si (KR); Woong Sik Kim, Seoul (KR); Jeong Won Kim, Hwaseong-si (KR); Donghwan Bae, Seoul (KR); Jin-Su Byun, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/889,313

(22) Filed: Aug. 16, 2022

(65) Prior Publication Data

US 2023/0140270 A1    May 4, 2023

(30) Foreign Application Priority Data

Nov. 1, 2021   (KR) ........................ 10-2021-0147737

(51) Int. Cl.
*G06F 3/045* (2006.01)
*H10K 50/858* (2023.01)
(Continued)

(52) U.S. Cl.
CPC ......... *H10K 50/858* (2023.02); *G06F 3/0412* (2013.01); *G06F 3/0445* (2019.05);
(Continued)

(58) Field of Classification Search
CPC . H01L 51/5275; H01L 27/3246; H01L 51/56; H01L 27/3213; H01L 27/323;
(Continued)

(56) References Cited

U.S. PATENT DOCUMENTS

| 10,388,913 B2 | 8/2019 | Jung et al. |
| 10,734,452 B1 | 8/2020 | Kim et al. |

(Continued)

FOREIGN PATENT DOCUMENTS

| KR | 10-2019-0041558 | 4/2019 |
| KR | 10-2019-0062678 | 6/2019 |

(Continued)

*Primary Examiner* — Deeprose Subedi
(74) *Attorney, Agent, or Firm* — H.C. Park & Associates, PLC

(57) ABSTRACT

A display device includes: a substrate; a transistor disposed on the substrate; a pixel electrode connected to the transistor; a bank layer disposed on the pixel electrode having a pixel opening overlapping the pixel electrode; an emission layer disposed in the pixel opening; a common electrode disposed on the emission layer and the bank layer; an encapsulation layer disposed on the common electrode; a sensing electrode disposed on the encapsulation layer; a first insulator disposed on the encapsulation layer to overlap the pixel opening; a second insulator disposed outside the first insulator; and a third insulator disposed outside the second insulator. The first insulator has a first refractive index, the second insulator has a second refractive index, and the third insulator has a third refractive index, and the first refractive index, and wherein the second refractive index, and the third refractive index are different from each other.

19 Claims, 12 Drawing Sheets

(51) Int. Cl.
  *G06F 3/044* (2006.01)
  *G06F 3/041* (2006.01)
  *H10K 59/122* (2023.01)
  *H10K 71/00* (2023.01)
  *H10K 59/40* (2023.01)
  *H10K 59/35* (2023.01)
  *H10K 59/12* (2023.01)

(52) U.S. Cl.
  CPC ......... *G06F 3/0446* (2019.05); *H10K 59/122* (2023.02); *H10K 71/00* (2023.02); *G06F 2203/04111* (2013.01); *H10K 59/1201* (2023.02); *H10K 59/351* (2023.02); *H10K 59/40* (2023.02)

(58) Field of Classification Search
  CPC ............. H01L 2227/323; G06F 3/0445; G06F 3/0446; G06F 3/0412; G06F 2203/04111
  See application file for complete search history.

(56) References Cited

U.S. PATENT DOCUMENTS

| | | | |
|---|---|---|---|
| 2017/0077188 A1* | 3/2017 | Kang | .................. H01L 51/5262 |
| 2019/0115404 A1 | 4/2019 | Moon et al. | |
| 2021/0104702 A1 | 4/2021 | Jung et al. | |
| 2021/0143235 A1 | 5/2021 | Byun et al. | |
| 2022/0187937 A1* | 6/2022 | Jang | .................. H01L 51/5253 |

FOREIGN PATENT DOCUMENTS

| | | |
|---|---|---|
| KR | 10-2020-0089379 | 7/2020 |
| KR | 10-2020-0101571 | 8/2020 |
| KR | 10-2021-0041675 | 4/2021 |
| KR | 10-2021-0057877 | 5/2021 |

* cited by examiner

DISPLAY DEVICE

CROSS-REFERENCE TO RELATED APPLICATION

This application claims priority from and the benefit of Korean Patent Application No. 10-2021-0147737, filed on Nov. 1, 2021, which is hereby incorporated by reference for all purposes as if fully set forth herein.

BACKGROUND

Field

Embodiments of the invention relate generally to display devices and more specifically, to display devices having a light refraction pattern.

Discussion of the Background

A display device displays an image, and includes a liquid crystal display device, an organic light emitting diode display device, and the like. Such display devices are applied to various electronic devices such as mobile phones, navigation units, digital cameras, electronic books, portable game machines, and various terminals.

The display devices have a multi-layered structure. For example, the multi-layered structure of the display devices includes a light emitting element, a touch sensor, and the like, which are stacked on a substrate. The image may be displayed by light, which is generated from the light emitting element, passes through such layers, and is emitted to the outside of the display device.

The above information disclosed in this Background section is only for understanding of the background of the inventive concepts, and, therefore, it may contain information that does not constitute prior art.

SUMMARY

Applicant discovered that some portion of the light generated by the light emitting elements in display devices may not be emitted to the outside, e.g., due to internal light reflection at an interlayer interface. As a result, the front light emission efficiency and display quality of the display devices may be deteriorated or degraded.

Display devices constructed according to the principles and illustrative embodiments of the invention improve light emission efficiency and image quality, which may be accomplished by providing a light refraction pattern.

Additional features of the inventive concepts will be set forth in the description which follows, and in part will be apparent from the description, or may be learned by practice of the inventive concepts.

According to one aspect of the invention, a display device includes: a substrate; a transistor disposed on the substrate; a pixel electrode connected to the transistor; a bank layer disposed on the pixel electrode having a pixel opening overlapping the pixel electrode; an emission layer disposed in the pixel opening; a common electrode disposed on the emission layer and the bank layer; an encapsulation layer disposed on the common electrode; a sensing electrode disposed on the encapsulation layer; a first insulator disposed on the encapsulation layer to overlap the pixel opening; a second insulator disposed outside the first insulator; and a third insulator disposed outside the second insulator, wherein: the first insulator has a first refractive index, the second insulator has a second refractive index, and the third insulator has a third refractive index, and wherein the first refractive index, the second refractive index, and the third refractive index are different from each other.

The first refractive index may be higher than the second refractive index, and the second refractive index may be higher than the third refractive index.

The first insulator may include a first insulating layer, the second insulator may include a second insulating layer, the third insulator may include a third insulating layer, the second insulating layer may surround the first insulating layer, the third insulating layer may surround the second insulating layer, and the second insulating layer may be disposed between the first insulating layer and the third insulating layer.

The second insulator may have the central portion that overlap an edge of the pixel opening.

T first insulator may have a size smaller than that of the pixel opening when viewed in plan.

The first insulator may substantially entirely overlap the pixel opening.

The first insulator may not overlap the bank layer.

The third insulator may overlap the bank layer.

The third insulator may not overlap the pixel opening.

The first refractive index may be about 1.6 or more and about 1.7 or less, the second refractive index may be about 1.5 or more and about 1.6 or less, and the third refractive index may be about 1.4 or more and about 1.5 or less.

Each of the first insulator, the second insulator, and the third insulator may be substantially same thickness.

The first insulator may include a first insulating layer, the second insulator may include a second insulating layer, the third insulator may include a third insulating layer. The second insulator may be formed, and then the third insulator may be formed, and the first insulator may be formed after the third insulator is formed.

An edge of the first insulator and an edge of the third insulator may overlap each other on the second insulator.

The first insulator may be disposed on the third insulator in an overlapping portion of the first insulator and the third insulator.

The display device may further include: a sensing electrode connector connected to the sensing electrode; and a sensing insulator disposed between the sensing electrode and the sensing electrode connector.

The first insulator, the second insulator, and the third insulator may be disposed on the sensing insulator, and the third insulator may be disposed on the sensing electrode.

The sensing insulator may be made of a same material as that of the second insulator, and the sensing insulating layer and the second insulator may be disposed on a same layer.

The third insulator may be disposed between the second insulator and the sensing insulator.

The sensing insulator may have a thickness thinner than that of the second insulator.

The sensing insulator and the sensing electrode may be covered by the third insulator.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
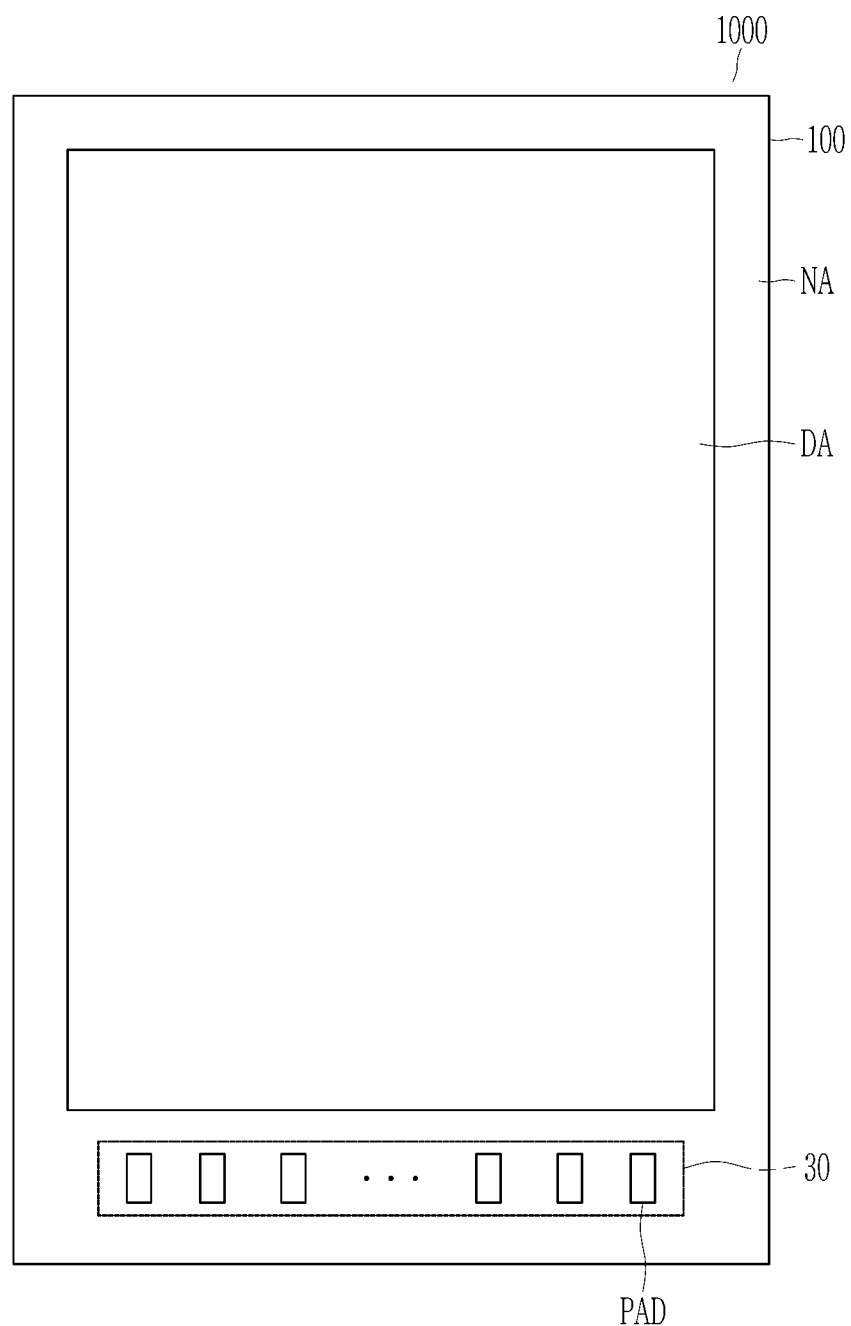
FIG. 1 is a plan view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z— axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device 1000 according to an embodiment will be described with reference to FIG. 1 and FIG. 2.

Figure 2:
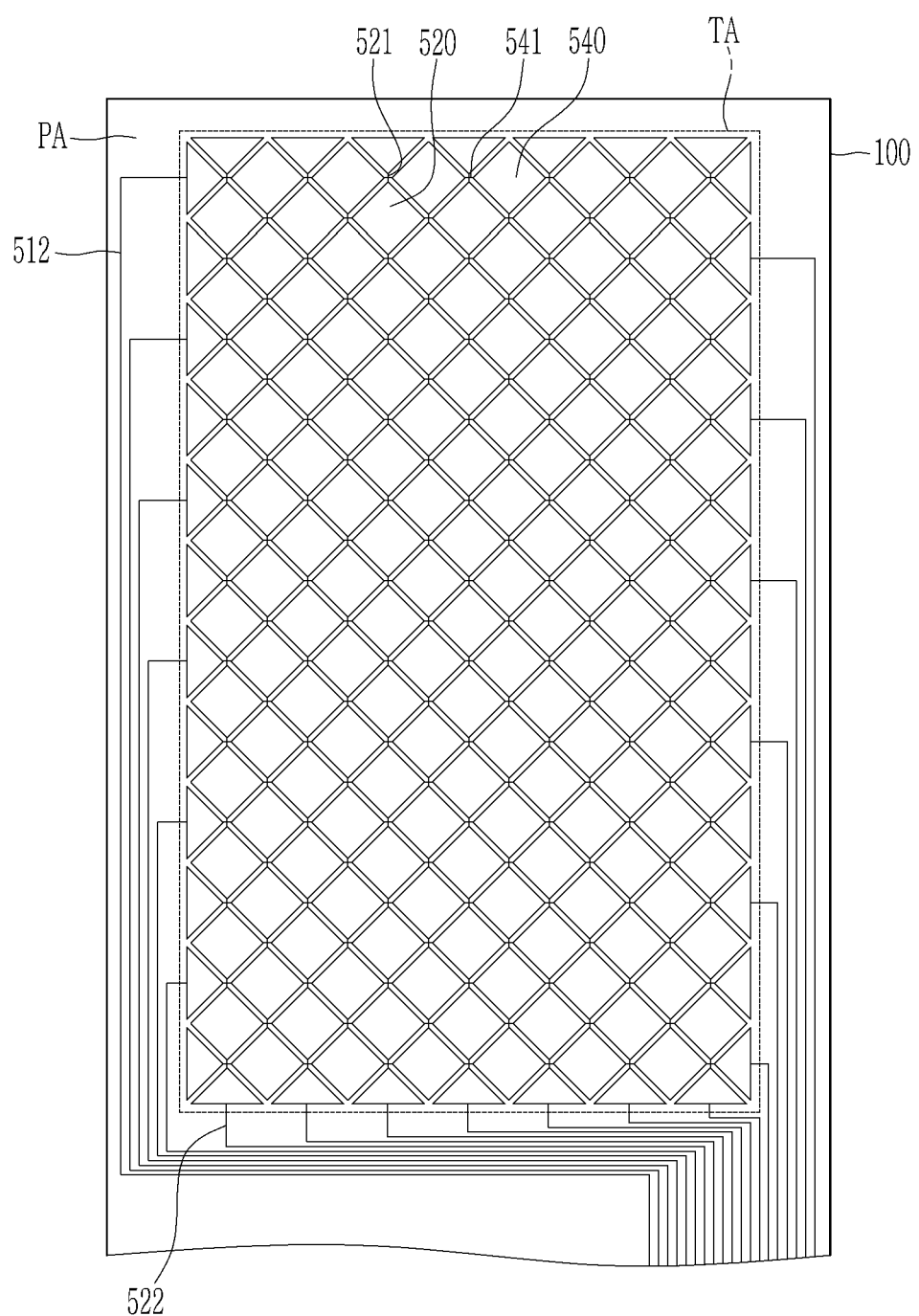
FIG. 2 is a plan view of a sensor of the display device of FIG. 1.

FIG. 1 illustrates a schematic top plan view of a display device 1000 according to an embodiment, and FIG. 2 illustrates a top plan view of a portion including a sensor in a display device 1000 according to an embodiment.

As illustrated in FIG. 1, the display device 1000 includes a substrate 100 and a pad portion 30.

The substrate 100 includes a display area DA and a non-display area NA. The display area DA is an area in which pixels including a light emitting diode and a transistor are formed to display an image, and the non-display area NA is an area in which an image is not displayed. The non-display area NDA may be positioned to surround a periphery of the display area DA. The non-display area NA is an area including the pad portion 30 in which pads PAD for applying driving signals to pixels are formed.

A plurality of pixels each including a transistor, a light emitting diode, and the like may be positioned in the display area DA. The pixels may be arranged in various forms or patterns, for example, may be arranged in a matrix form. A sensing area TA including a plurality of sensing electrodes 520 and 540 in FIG. 2 may be further positioned above the display area DA to sense a touch.

In the non-display area NA, a driving voltage line, a driving low voltage line, and the pad portion 30 may be positioned to transfer driving signals such as voltages and signals to pixels formed in the display area DA. In addition, a plurality of sensing wires 512 and 522 (see FIG. 2) may be further positioned in the non-display area NA. The sensing wires 512 and 522 may be connected to the sensing electrodes 520 and 540. The sensing wires 512 and 522 and the sensing electrodes 520 and 540 will be further described below with reference to FIG. 2.

The pad portion 30 is positioned in a portion of the non-display area NA, and includes a plurality of pads PAD. Voltages, signals, etc. may be applied to a plurality of voltage lines connected to the display area DA through the pads PAD, and the sensing wires 512 and 522 (see FIG. 2). A flexible printed circuit board (FPCB) may be attached to the non-display area NA. The FPCB may be electrically connected to the pad portion 30. The FPCB and the pad portion 30 may be electrically connected by an anisotropic conductive film. The FPCB may include an integrated chip, and a driving signal outputted from the driving integrated circuit may be supplied to each pixel through the pads PAD of the pad portion 30.

As illustrated in FIG. 2, the substrate 100 further includes a sensing area TA in which the sensing electrodes 520 and 540 are formed at an upper portion of the display area DA, and a peripheral area PA surrounding the sensing area TA. The sensing area TA may include the display area DA and the non-display area NA of FIG. 1, and the peripheral area PA may include an area excluding the sensing area TA from the non-display area NA of FIG. 1. However, this is merely an example, and positions of the sensing area TA and the peripheral area PA may be variously changed or modified. For example, the sensing area TA may include a portion of the display area DA, and the peripheral area PA may include an area excluding the sensing region TA from the display area DA, and a non-display area (NA). Alternatively, the sensing area TA may include a display area DA and a non-display area NA.

The sensing electrodes 520 and 540 may be positioned in the sensing area TA. The sensing electrodes 520 and 540 may include a plurality of first sensing electrodes 520 and a plurality of second sensing electrodes 540. The sensing electrodes 520 and 540 may be formed on a same substrate 100 as the substrate 100 including a plurality of pixels. For example, a plurality of pixels and the sensing electrodes 520 and 540 may be positioned within a single panel.

The first sensing electrodes 520 and the second sensing electrodes 540 may be electrically separated from each other. The first sensing electrodes 520 may be sensing input electrodes, and the second sensing electrodes 540 may be sensing output electrodes. However, embodiments are not limited thereto, and the first sensing electrodes 520 may be the sensing output electrodes, and the second sensing electrodes 540 may be the sensing input electrodes.

The first sensing electrodes 520 and the second sensing electrodes 540 may be alternately distributed or disposed and may not overlap each other in the sensing area TA. For example, the first sensing electrodes 520 and the second sensing electrodes 540 may be disposed in a mesh form. The first sensing electrodes 520 may be positioned or arranged in plural in a column direction and may be disposed or arranged in plural in a row direction. The second sensing electrode 540 may also be positioned or arranged in plural in the column direction and may be disposed or arranged in plural in the row direction. The first sensing electrodes 520 may be connected to each other in the column direction by a plurality of first sensing electrode connectors 521, and the second sensing electrodes 540 may be connected to each other in the row direction by a plurality of second sensing electrode connectors 541.

The first sensing electrodes 520 and the second sensing electrodes 540 may be positioned directly on a same layer. The first sensing electrodes 520 and the second sensing electrodes 540 may be positioned on different layers. The first sensing electrodes 520 and the second sensing electrodes 540 may have a generally rhomboidal shape, but embodiments are not limited thereto. For example, the first sensing electrode 520 and the second sensing electrode 540 may have other generally polygonal shapes such as a quadrangle or a hexagon, or a circular or elliptical shape, and may be implemented in various other configurations such as having a protrusion to improve sensitivity of a sensor. The first sensing electrodes 520 and the second sensing electrodes 540 may be formed as a transparent conductor or an opaque conductor. For example, the first sensing electrodes 520 and the second sensing electrodes 540 may include a transparent conductive oxide (TCO), and the TCO may include at least one of an indium tin oxide (ITO), an indium zinc oxide (IZO), a zinc oxide (ZnO), a carbon nanotube (CNT), and graphene. In addition, the first sensing electrodes 520 and the second sensing electrodes 540 may have a plurality of openings. The openings formed in the sensing electrodes 520 and 540 may guide light emitted from a light emitting diode to be emitted to the front of the display device 1000 without interference.

The first sensing electrodes 520 may be electrically connected to each other by the first sensing electrode connectors 521 (also referred to as bridges), and the second sensing electrodes 540 may be electrically connected to each other by the second sensing electrode connectors 541. When the first sensing electrodes 520 are connected to each other in a first direction, the second sensing electrodes 540 may be connected to each other in a second direction intersecting the first direction. When the first sensing electrodes 520 and the second sensing electrodes 540 are positioned directly on the same layer, one of the first sensing electrode connector 521 and the second sensing electrode connector 541 may be positioned directly on the same layer, on which the first sensing electrodes 520 and the second sensing electrodes 540 are disposed, and the other one may be positioned on a different layer, on which the first sensing electrodes 520 and the second sensing electrodes 540 are not disposed. As a result, the first sensing electrodes 520 and the second sensing electrodes 540 may be electrically separated from each other. The sensing electrode connector disposed on the different layer may be disposed at an upper layer or a lower layer of the first sensing electrodes 520 and the second sensing electrodes 540, and in embodiments described below, the description will focus an embodiment in which the sensing electrode connector is disposed on the lower layer, i.e., a layer closer to the substrate, for descriptive convenience.

The sensing wires 512 and 522 are respectively connected to the first sensing electrodes 520 and the second sensing electrodes 540 in the peripheral area PA. The sensing wires 512 and 522 may include the first sensing wires 512 and the second sensing wires 522. The first sensing wire 512 may be connected to the second sensing electrodes 540 disposed in the row direction, and the second sensing wire 522 may be connected to the first sensing electrodes 520 disposed in the column direction. The first sensing wire 512 and the second sensing wire 522 may be electrically connected to some of the pads PAD included in the pad portion 30 of FIG. 1.

In FIG. 2, a sensor of a mutual-capacitance type that senses a touch using two sensing electrodes 520 and 540 is illustrated. However, according to other embodiments, a sensor of a self-capacitance type that senses a touch using only one sensing electrode may be used.

A display device 1000 according to an embodiment will now be further described with reference to FIG. 3 and FIG. 4.

Figure 3:
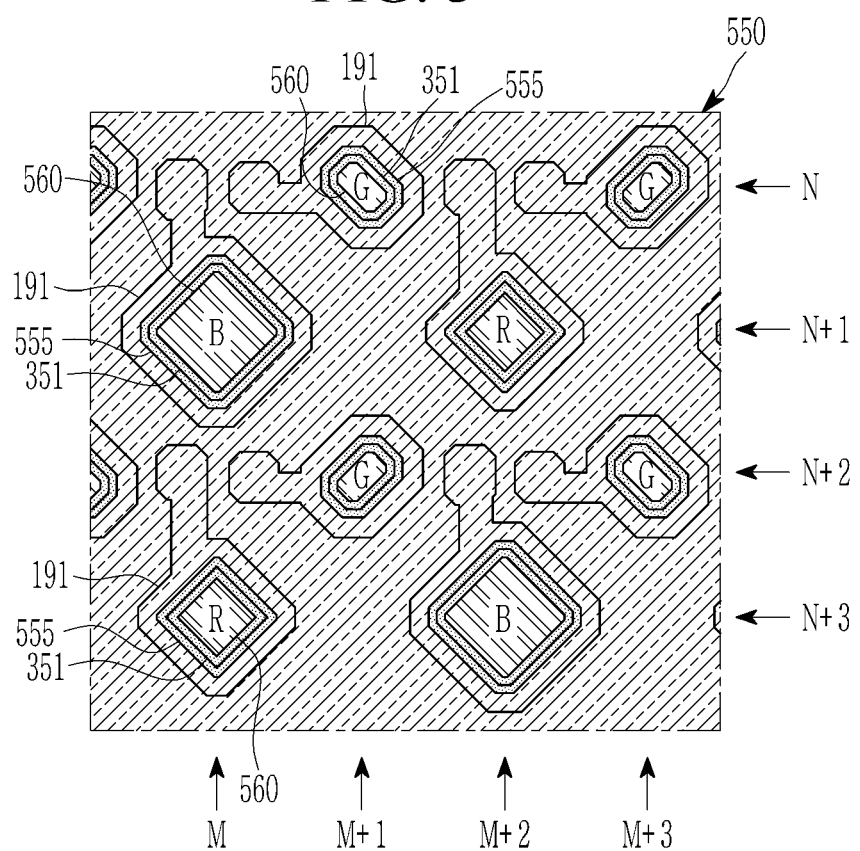
FIG. 3 is a plan view of a portion of the display area of the display device of FIG. 1.
Figure 4:
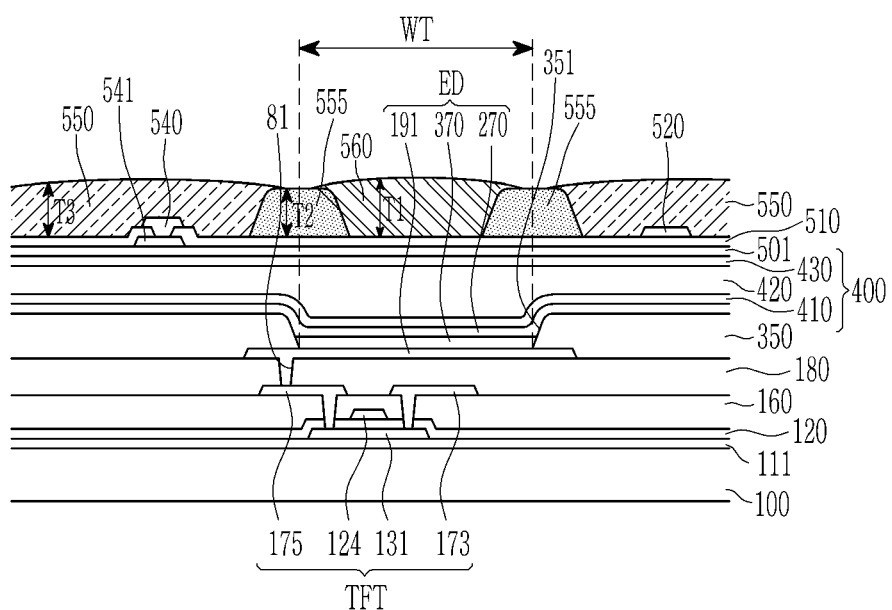
FIG. 4 is a cross-sectional view of an embodiment of a portion of the display area of the display device of FIG. 1.

FIG. 3 illustrates a top plan view of a portion of a display device 1000 according to an embodiment, and FIG. 4 illustrates a cross-sectional view showing a portion of a display device 1000 according to an embodiment.

As illustrated in FIG. 3, the display device 1000 may include a plurality of pixels R, G, and B. The pixels R, G, and B may include a first pixel R, a second pixel G, and a third pixel B. The first pixel R may emit red light, the second pixel G may emit green light, and the third pixel B may emit blue light. However, this is merely an example, and the pixels may further include pixels for emitting other color lights in addition to the red, green, and blue lights. For example, the pixels may further include a white pixel. Alternatively, the pixels may include a pixel for displaying cyan light, a pixel for displaying magenta light, and a pixel for displaying yellow light.

As illustrated in FIG. 4, in the display device 1000, the display area DA may include a substrate 100, a semiconductor layer 131, a transistor (TFT) including a gate electrode 124, a source electrode 173, and a drain electrode 175, a gate insulating layer 120, a first interlayer insulating layer 160, a second interlayer insulating layer 180, a pixel electrode 191, an emission layer 370, a bank layer 350, a common electrode 270, and an encapsulation layer 400. Herein, the pixel electrode 191, the emission layer 370, and the common electrode 270 may form a light emitting diode ED. In addition, the display device 1000 further includes the sensing area TA positioned above the display area DA, wherein the sensing area TA may include a sensing insulating layer 510, a plurality of sensing electrodes 520 and 540, and a second sensing electrode connector 541. In addition, the display device 1000 may further include a first insulator that may be in the form of first insulating layer 560, a second insulator that may be in the form of second insulating layer 555, and a third insulator that may be in the form of third insulating layer 550 disposed above the sensing area TA.

The substrate 100 may include a rigid material such as glass, or a flexible material such as plastic or polyimide that is bendable. A first buffer layer 111 may be further positioned on the substrate 100 to provide a flat surface for planarizing a top surface of the substrate 100 and to prevent penetration of impurity elements. The first barrier layer 111 may include an inorganic material, and for example, may include an inorganic insulating material such as a silicon nitride ($SiN_x$), a silicon oxide ($SiO_x$), and a silicon oxynitride ($SiO_xN_y$). The first buffer layer 111 may have a single layer structure or a multi-layered structure. A barrier layer may be further positioned on the substrate 100. In this case, the barrier layer may be positioned between the substrate 100 and the first buffer layer 111. The barrier layer may include an inorganic insulating material such as a silicon nitride ($SiN_x$), a silicon oxide ($SiO_x$), and a silicon oxynitride ($SiO_xN_y$). The barrier layer BA may have a single layer structure or a multi-layered structure.

The semiconductor layer 131 may be positioned on the substrate 100. The semiconductor layer 131 may include any one of amorphous silicon, polycrystalline silicon, and an oxide semiconductor. For example, the semiconductor layer 131 may include low temperature polysilicon (LTPS), or may include an oxide semiconductor material including at least one of zinc (Zn), indium (In), gallium (Ga), tin (Sn), and a mixture thereof. For example, the semiconductor layer 131 may include an indium-gallium-zinc oxide (IGZO). The semiconductor layer 131 may include a channel region, a source region, and a drain region into which may or may not they be doped with impurities. The source region and the drain region may have a conductive characteristic corresponding to a conductor.

The gate insulating layer 120 may cover the semiconductor layer 131 and the substrate 100. The gate insulating layer 120 may include an inorganic insulating material such as a silicon nitride ($SiN_x$), a silicon oxide ($SiO_x$), and a silicon oxynitride ($SiO_xN_y$). The gate insulating layer 120 may have a single layer structure or a multi-layered structure.

The gate electrode 124 may be positioned on the gate insulating layer 120. The gate electrode 124 may include a metal such as copper (Cu), molybdenum (Mo), aluminum (Al), silver (Ag), chromium (Cr), or tantalum (Ta), or a metal alloy thereof. The gate electrode 124 may be formed as a single layer or a multi-layer. A region of the semiconductor layer 131, which overlaps the planar gate electrode 124, may be a channel region.

The first interlayer insulating layer 160 may cover the gate electrode 124 and the gate insulating layer 120. The first interlayer insulating layer 160 may include an inorganic insulating material such as a silicon nitride ($SiN_x$), a silicon oxide ($SiO_x$), and a silicon oxynitride ($SiO_xN_y$). The first interlayer insulating layer 160 may have a single layer structure or a multi-layered structure.

The source electrode 173 and the drain electrode 175 are positioned on the first interlayer insulating layer 160. The source electrode 173 and the drain electrode 175 may be connected to the source region and the drain region of the semiconductor layer 131 through openings formed in the first interlayer insulating layer 160 and the gate insulating layer 120, respectively. Accordingly, the semiconductor layer 131, the gate electrode 124, the source electrode 173, and the drain electrode 175 described above constitute one thin film transistor TFT. The transistor TFT may include only the source region and the drain region of the semiconductor layer 131 instead of the source electrode 173 and the drain electrode 175.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a metal alloy thereof. The source electrode 173 and the drain electrode 175 may be formed as a single layer or a multi-layer. The source electrode 173 and the drain electrode 175 may be configured as a triple layer including an upper layer, an intermediate layer and a lower layer, the upper layer and the lower layer may include titanium (Ti), and the intermediate layer may include aluminum (Al).

The second interlayer insulating layer 180 may be positioned on the source electrode 173 and the drain electrode 175. The second interlayer insulating layer 180 may cover the source electrode 173, the drain electrode 175, and the first interlayer insulating layer 160. The second interlayer insulating layer 180 may be formed to provide a planarized surface on the transistor TFT. For example, the second interlayer insulating layer 180 may be an organic insulating layer, and may include at least one material of a polyimide, a polyamide, an acrylic resin, benzocyclobutene, and a phenol resin.

The pixel electrode 191 may be positioned on the second interlayer insulating layer 180. The pixel electrode 191 is also referred to as an anode, and may be formed as a single layer including a transparent conductive oxide film or a metal material or as multiple layers including the transparent conductive oxide film or the metal material. The transparent conductive oxide layer may include an indium tin oxide (ITO), a poly-ITO, an indium zinc oxide (IZO), an indium gallium zinc oxide (IGZO), an indium tin zinc oxide (ITZO), and the like. The metal material may include silver (Ag), molybdenum (Mo), copper (Cu), gold (Au), and aluminum (Al).

The second interlayer insulating layer 180 may include a via hole 81 exposing the drain electrode 175. The drain electrode 175 and the pixel electrode 191 may be physically and electrically connected through the via hole 81 of the second interlayer insulating layer 180. Accordingly, the pixel electrode 191 can receive an output current to be transferred from the drain electrode 175 to the emission layer 370.

The bank layer 350 may be positioned on the pixel electrode 191 and the second interlayer insulating layer 180. The bank layer 350 is also referred to as a pixel defining layer (PDL). For example, the bank layer 350 may have a pixel opening 351 overlapping at least a portion of the pixel electrode 191. In this case, the pixel opening 351 may overlap a central portion of the pixel electrode 191, and may not overlap an edge portion of the pixel electrode 191. As a result, a size of the pixel opening 351 may be smaller than that of the pixel electrode 191. The bank layer 350 may define a position of the emission layer 370 such that the emission layer 370 may be positioned on a portion of the pixel electrode 191, e.g., an upper surface of the pixel electrode 191 exposed by the bank layer 350. The bank layer 350 may be formed as an organic insulator including at least one material of a polyimide, a polyamide, an acryl resin, benzocyclobutene, and a phenol resin. The bank layer 350 may be formed as a black pixel define layer (BPDL) including a black pigment.

The pixel opening 351 may have a shape similar to that of the pixel electrode 191 when viewed in plan. For example, the pixel opening 351 and the pixel electrode 191 may have a substantially polygonal shape when viewed in plan. In this case, corner portions of the pixel opening 351 and the pixel electrode 191 may be chamfered. In addition, the pixel electrode 191 may include an extended portion to be connected to the drain electrode 175. However, planar shapes of the pixel opening 351 and the pixel electrode 191 are not limited thereto, and may be variously changed or modified.

In this case, a plurality of pixel electrodes 191 corresponding to each of the first pixel R, the second pixel G, and the third pixel B may have different sizes when viewed in plan. Similarly, the pixel openings 351 corresponding to each of the first pixel R, the second pixel G, and the third pixel B may have different sizes when viewed in plan. For example, the pixel opening 351 and the pixel electrode 191 corresponding to the first pixel R may respectively have larger sizes than the pixel opening 351 and the pixel electrode 191 corresponding to the second pixel G when viewed in plan. In addition, the pixel opening 351 and the pixel electrode 191 corresponding to the first pixel R may respectively have sizes that are smaller than or similar to those of the pixel opening 351 and the pixel electrode 191 corresponding to the third pixel B when viewed in plan. However, embodiments are not limited thereto, and sizes of the pixel opening 351 and the pixel electrode 191 of each of the pixels R, G, and B may be variously changed or modified.

In addition, the pixels of the display device 1000 may be positioned along a row direction and a column direction. For example, the pixel electrodes 191 corresponding to the second pixel G are positioned to be spaced apart from each other by a predetermined interval in an $N^{th}$ row, and the pixel electrodes 191 corresponding to the third pixel B and the pixel electrodes 191 corresponding to the first pixel R may be alternately positioned in an adjacent $(N+1)^{th}$ row. Similarly, the pixel electrodes 191 corresponding to the second pixel G are positioned to be spaced apart from each other by a predetermined interval in an adjacent $(N+2)^{th}$ row, and the pixel electrodes 191 corresponding to the first pixel R and the pixel electrodes 191 corresponding to the third pixel B may be alternately positioned in an adjacent $(N+3)^{th}$ row.

In addition, the pixel electrodes 191 corresponding to the second pixels G positioned in the $N^{th}$ row may be alternately positioned with the pixel electrode 191 corresponding to the third pixel B and the first pixel R positioned in the $(N+1)^{th}$ row. For example, the pixel electrode 191 corresponding to the third pixel B and the pixel electrodes 191 corresponding to the first pixel R are alternately positioned in an $M^{th}$ column, and the pixel electrodes 191 corresponding to the second pixel G may be positioned to be spaced apart from each other by a predetermined interval in an adjacent $(M+1)^{th}$ column. Similarly, the pixel electrodes 191 corresponding to the first pixel R and the pixel electrode 191 corresponding to the third pixel B are alternately positioned in an adjacent $(M+2)^{th}$ column, and the pixel electrodes 191 corresponding to the second pixel G may be positioned to be spaced apart from each other by a predetermined interval in an adjacent $(M+3)^{th}$ column. The pixel electrodes 191 may be repetitively positioned on the substrate 100 to have the above-described structure.

The emission layer 370 may be disposed within the pixel opening 351 defined by the bank layer 350. The emission layer 370 may be positioned over the pixel electrodes 191. The emission layer 370 may include an organic material that emits light such as red, green, and blue light. The emission layer 370 for emitting red, green, and blue light may include a low molecular weight organic material or a high molecular weight organic material. The emission layer 370 positioned in the first pixel R may include an organic material for emitting red light. The emission layer 370 positioned in the second pixel G may include an organic material for emitting green light. The emission layer 370 positioned in the third pixel B may include an organic material for emitting blue light.

Although the emission layer 370 is illustrated as a single layer, actually, auxiliary layers such as an electron injection layer, an electron transport layer, a hole transport layer, and a hole injection layer may also be further positioned above and below the emission layer 370. In this case, a hole injection layer and a hole transport layer may be positioned under the emission layer 370, and an electron transport layer and an electron injection layer may be positioned above the emission layer 370.

A spacer may be further positioned on the bank layer 350. The spacer may include a same material as that of the bank layer 350. However, embodiments are not limited thereto, and the spacer may be made of a material that is different from that of the bank layer 350. The spacer may be formed as an organic insulator including at least one material of a polyimide, a polyamide, an acryl resin, benzocyclobutene, and a phenol resin.

The common electrode 270 may be positioned on the bank layer 350 and the emission layer 370. The common electrode 270 of each of the pixels R, G, and B may be connected to each other. The common electrode 270 may be positioned on the substrate 100 to be entirely connected to the pixels R, G, and B. The common electrode 270 may be referred to as a cathode, and may be formed of a transparent conductive layer including an indium tin oxide (ITO), an indium zinc oxide (IZO), an indium gallium zinc oxide (IGZO), an indium tin zinc oxide (ITZO), etc. In addition, the common electrode 270 may have a translucent characteristic, and in this case, the common electrode 270 may constitute a micro-cavity together with the pixel electrode 191. According to such a micro-cavity structure, light of a specific wavelength is emitted to an upper part by the characteristics and spacing between both of the electrodes, and as a result, red, green, or blue light may be displayed.

The pixel electrode 191, the emission layer 370, and the common electrode 270 may constitute a light emitting diode ED. A portion where the pixel electrode 191, the emission layer 370, and the common electrode 270 overlap may be an emission area of a light emitting diode ED.

The encapsulation layer 400 may be disposed on the common electrode 270. The encapsulation layer 400 may include at least one inorganic layer and at least one organic layer. In an embodiment, the encapsulation layer 400 may include a first inorganic encapsulation layer 410, an organic encapsulation layer 420, and a second inorganic encapsulation layer 430. However, this is merely an example, and numbers of inorganic and organic layers included in the encapsulation layer 400 may be variously changed or modified. The first inorganic encapsulation layer 410, the organic encapsulation layer 420, and the second inorganic encapsulation layer 430 may be disposed in a portion of the non-display area NA and the display area DA. The organic encapsulation layer 420 may be formed around the display area DA. The first inorganic encapsulation layer 410 and the second inorganic encapsulation layer 430 may be formed up to the non-display area NA. The encapsulation layer 400, which is for protecting the light emitting diode ED from moisture or oxygen that may penetrate from the outside, may directly contact first ends of the first inorganic encapsulation layer 410 and the second inorganic encapsulation layer 430.

A second buffer layer 501 may be disposed on the encapsulation layer 400. The second buffer layer 501 may be formed of an inorganic insulating layer, and an inorganic material included in the inorganic insulating layer may be at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride The second buffer layer 501 may be omitted.

A second sensing electrode connector 541, a sensing insulating layer 510, and a plurality of sensing electrodes 520 and 540 may be positioned on the second buffer layer 501. For example, a first sensing electrode connector 521 (see FIG. 2) may be positioned on the second buffer layer 501. One of the first sensing electrode connector (521 in FIG. 2) and the second sensing electrode connector 541 may be positioned on a same layer on which the sensing electrodes 520 and 540 are disposed, and the other may be positioned on a different layer on which the sensing electrodes 520 and 540 are not disposed. Hereinafter, an example, in which the second sensing electrode connector 541 is positioned on a different layer from that of the sensing electrodes 520 and 540 are not disposed, will be described.

The second sensing electrode connector 541, the sensing insulating layer 510, and the sensing electrodes 520 and 540 may constitute a sensing sensor. The sensing sensor may be classified into a resistive type, a capacitive type, an electromagnetic type, and an optical type. The sensing sensor may be a capacitive type of sensor.

The second sensing electrode connector 541 may be positioned on the second buffer layer 501, and the sensing insulating layer 510 may be positioned on the second buffer layer 501 and the second sensing electrode connector 541. The sensing insulating layer 510 may include an inorganic insulating material or an organic insulating material. An inorganic insulating material may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. An organic insulating material may include at least one of an acrylic resin, a methacrylic resin, a polyisoprene, a vinyl resin, an epoxy resin, a urethane resin, a cellulose resin, and a perylene resin.

The sensing electrodes 520 and 540 may be positioned on the sensing insulating layer 510. The sensing electrodes 520 and 540 may include the first sensing electrodes 520 and the second sensing electrodes 540. The first sensing electrodes 520 and the second sensing electrodes 540 may be electrically insulated from each other. The sensing insulating layer 510 may include an opening exposing an upper surface of the second sensing electrode connector 541, and the second sensing electrode connector 541 is connected to the second sensing electrodes 540 through the opening of the sensing insulating layer 510 to electrically connect two adjacent second sensing electrodes 540. For example, the first sensing electrode connector (e.g., 521 in FIG. 2) connecting the first sensing electrodes 520 is formed on the same layer (e.g., the sensing insulating layer 510) on which the first sensing electrodes 520 and the second sensing electrodes 540 are disposed.

The sensing electrodes 520 and 540 may include a conductive material having good conductivity. For example, the sensing electrode 520 and 540 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), or the like, or a metal alloy thereof. The sensing electrodes 520 and 540 may be formed as a single layer or a multi-layer. In this case, the sensing electrodes 520 and 540 may have an opening so that light emitted from the light emitting diode is emitted upward without any interference. The sensing electrodes 520 and 540 may be configured as a triple layer including an upper layer, an intermediate layer, and a lower layer. For example, the upper layer and the lower layer may include titanium (Ti), and the intermediate layer may include aluminum (Al).

The first insulating layer 560, the second insulating layer 555, and the third insulating layer 550 may be positioned on the sensing insulating layer 510. For example, the first insulating layer 560, the second insulating layer 555, and the third insulating layer 550 may form a light refraction pattern for improving light emission efficiency and image quality of the display device 1000. The first insulating layer 560, the second insulating layer 555, and the third insulating layer 550 are positioned on the encapsulation layer 400.

The first insulating layer 560 may overlap the light emitting diode ED. For example, the first insulating layer 560 may overlap the pixel electrode 191, may overlap the emission layer 370, and may overlap the pixel opening 351. The first insulating layer 560 may have a similar shape as that of the pixel opening 351 when viewed in plan. For example, the first insulating layer 560 may have a substantially polygonal shape when viewed in plan. In this case, a corner portion of the first insulating layer 560 may be chamfered. However, the planar shape of the first insulating layer 560 is not limited thereto, and may be variously changed or modified. The size of the first insulating layer 560 may be smaller than that of the pixel opening 351 when viewed in plan. The entire first insulating layer 560 may overlap the pixel opening 351. Accordingly, the first insulating layer 560 may not overlap the bank layer 350.

The second insulating layer 555 may be positioned outside the first insulating layer 560. The second insulating layer 555 may have a shape surrounding the first insulating layer 560. The second insulating layer 555 may be positioned between the first insulating layer 560 and the third insulating layer 550. The central portion of the second insulating layer 555 may overlap an edge of the pixel opening 351. Accordingly, about half of the second insulating layer 555 may overlap the pixel opening 351, and the other half of the second insulating layer 555 may overlap the bank layer 350. The second insulating layer 555 may have a ring shape when viewed in plan. The second insulating layer 555 may include an inner edge (e.g., an inner side) and an outer edge (e.g., an outer side). The inner edge of the second insulating layer 555 may be in contact with the first insulating layer 560. The inner edge of the second insulating layer 555 may have an inclined surface, and the first insulating layer 560 may be positioned on the inclined surface of the second insulating layer 555. For example, the first insulating layer 560 may cover the inclined surface of the second insulating layer 555. The outer edge of the second insulating layer 555 may be in contact with the third insulating layer 550. The outer edge of the second insulating layer 555 may have an inclined surface, and the third insulating layer 550 may be positioned on the inclined surface of the second insulating layer 555. For example, the third insulating layer 550 may cover the inclined surface of the second insulating layer 555.

The third insulating layer 550 may be positioned outside the second insulating layer 555. The third insulating layer 550 may have a shape at least partially surrounding the second insulating layer 555. For example, the third insulating layer 550 may include an opening corresponding to the shape of the outer edge of the second insulating layer 555. The opening of the third insulating layer 550 may overlap the pixel opening 351. The size of the opening of the third insulating layer 550 may be larger than the size of the pixel opening 351. The pixel opening 351 may be positioned in the opening of the third insulating layer 550 when viewed in plan. The third insulating layer 550 may overlap the bank layer 350. The third insulating layer 550 may not overlap the pixel opening 351. The third insulating layer 550 may partially overlap the second insulating layer 555, or may not overlap the first insulating layer 560. The third insulating layer 550 may be positioned on the sensing electrodes 520 and 540. Accordingly, the sensing electrodes 520 and 540 may be covered by the third insulating layer 550.

The thickness T1 of the first insulating layer 560, the thickness T2 of the second insulating layer 555, and the thickness T3 of the third insulating layer 550 may be similar. The thickness T1 of the first insulating layer 560, the thickness T2 of the second insulating layer 555, and the thickness T3 of the third insulating layer 550 may be substantially the same. Accordingly, the height of an upper surface of the first insulating layer 560, the height of an upper surface of the second insulating layer 555, and the height of an upper surface of the third insulating layer 550 may be similar.

The width WT of the second insulating layer 555 may be greater than or equal to about 2 μm and less than or equal to about 4 μm. The second insulating layer 555 may overlap the edge of the pixel opening 351, and the width WT of the second insulating layer 555 may be appropriately selected in consideration of process dispersion.

the refractive index of the first insulating layer 560, the refractive index of the second insulating layer 555, and the refractive index of the third insulating layer 550 are different. The refractive index of the first insulating layer 560 may be higher than that of the second insulating layer 555. The refractive index of the second insulating layer 555 may be higher than that of the third insulating layer 550. Accordingly, the refractive index of the first insulating layer 560 may be higher than that of the third insulating layer 550.

For example, the refractive index of the first insulating layer 560 may be greater than or equal to about 1.6 and less than or equal to about 1.7. The refractive index of the second insulating layer 555 may be greater than or equal to about 1.5 and less than or equal to about 1.6. The refractive index of the third insulating layer 550 may be greater than or equal to about 1.4 and less than or equal to about 1.5. However, this is merely an example, and the refractive index of the first insulating layer 560, the refractive index of the second insulating layer 555, and the refractive index of the third insulating layer 550 may be variously changed or modified. For example, when the refractive index of the first insulating layer 560 is higher than the above examples, the refractive indexes of the second insulating layer 555 and the third insulating layer 550 may also be higher. Conversely, when the refractive index of the first insulating layer 560 is lower than the above examples, the refractive indexes of the second insulating layer 555 and the third insulating layer 550 may be lowered.

The first insulating layer 560, the second insulating layer 555, and the third insulating layer 550 may be made of an organic insulating material. The refractive index of each of the first insulating layer 560, the second insulating layer 555, and the third insulating layer 550 may be adjusted according to a functional group included in each layer. Alternatively, the refractive indexes of the first insulating layer 560, the second insulating layer 555, and the third insulating layer 550 may be adjusted according to the type and content of nanoparticles included in each layer.

For example, the refractive index of a layer made of a material in which hollow silica is dispersed in an acryl-based resin, a siloxane resin, or the like may be about 1.30 to about 1.53. The refractive index of a layer made of an acrylic resin including fluorine (F) may be about 1.38 to about 1.53. The refractive index of a layer made of a material including a functional group such as an aromatic ring in a binder of a resin such as an acrylic resin, a siloxane resin, or a polyimide may be about 1.50 to about 1.65. The refractive index of a layer made of an acryl-based resin including a halogen element such as iodine (I) and bromine (Br) or an element such as sulfur (S), phosphorus (P), and silicon (Si) may have a refractive index of about 1.60 to about 1.70. The refractive index of a layer made of an acryl-based resin including nano particles such as a titanium oxide ($TiO_2$), a zirconium oxide ($ZrO_2$), and graphene may be about 1.50 to about 1.90. The refractive index of a layer made of an organometallic polymer including an acryl-based resin, a siloxane resin, or the like may be about 1.60 to about 1.90. The refractive indices mentioned above may be a value measured by using light (e.g., sodium D-line) of about 589 nm.

The first insulating layer 560, the second insulating layer 555, and the third insulating layer 550 may be formed by patterning an organic insulating material having photosensitivity. For example, after forming the organic insulating material having photosensitivity as a whole, and then a photo process may be performed on the organic insulating material having photosensitivity. Alternatively, the organic insulating material may be formed as a whole by a method such as slit coating, spin coating, or screen printing, and then a photoresist may be formed. Finally, a desired pattern may be formed by performing photo and etching processes.

For example, a polarization layer may be further disposed on the second insulating layer 555. The polarization layer may be positioned in the sensing area TA, and may include a linear polarization plate, a retardation plate, and the like.

A cover window for protecting the sensing area TA and the display area DA may be further positioned on the sensing area TA. In this case, an adhesive layer may be further positioned between the polarization layer and the cover window.

The display device 1000 may include the first insulating layer 560, the second insulating layer 555, and the third insulating layer 550 having different refractive indexes, thereby improving front visibility and light output efficiency of the display device 1000. Hereinafter, an illustrative path of light generated in the display device 1000 will be described with further reference to FIG. 5.

Figure 5:
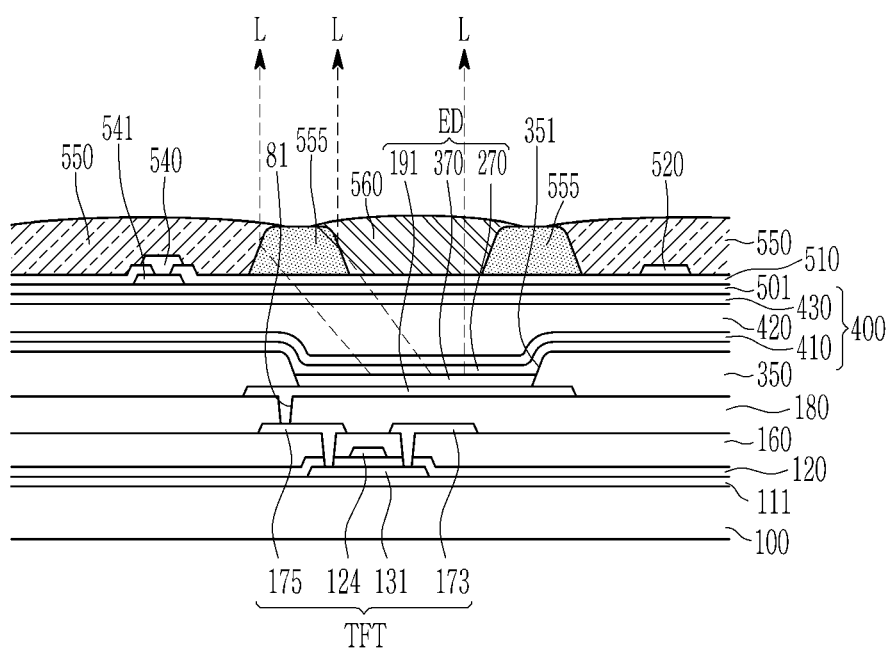
FIG. 5 is a cross-section view illustrating a path of light generated from a light emitting diode of the display device of FIG. 1.

FIG. 5 illustrates a path of light generated from a light emitting diode of a display device 1000 according to an embodiment.

As illustrated in FIG. 5, light L generated from the light emitting diode ED may pass through the first insulating layer 560 to exit to the front of the display device 1000. For example, the light L may exit in a direction that is perpendicular to the substrate 100. A portion of the light L generated from the light emitting diode ED may travel in an oblique direction to the substrate 100, and may be reflected back by a cover window. In the display device 1000, however, the light L generated from the light emitting diode ED may be reflected at an interface between the first insulating layer 560 and the second insulating layer 555 to be emitted to the front of the display device 1000. When the incident angle of the light L incident on the first insulating layer 560 is greater than a critical angle, the incident light L may be totally reflected at the interface between the first insulating layer 560 and the second insulating layer 555. For example, the light L that is incident on the first insulating layer 560 having a relatively large refractive index may travel to the second insulating layer 555 having a relatively small refractive index, and may be totally reflected at the interface between the first insulating layer 560 and the second insulating layer 555. In this case, the interface between the first insulating layer 560 and the second insulating layer 555 may form a substantially straight line parallel to the substrate 100 at a predetermined angle. The interface between the first insulating layer 560 and the second insulating layer 555 may be a side surface of the second insulating layer 555. Accordingly, the side surface of the second insulating layer 555 may be inclined at a predetermined inclination angle with respect to the upper surface of the sensing insulating layer 510.

In addition, in the display device 1000, the light L generated from the light emitting diode ED may be refracted at an interface between the second insulating layer 555 and the third insulating layer 550 to be emitted to the front of the display device 1000. Light refracted while passing through the side surface of the second insulating layer 555 may pass through the third insulating layer 550 to exit to the front of the display device 1000.

As such, in the display device 1000, front light output efficiency may be improved by the light L that passes through the first insulating layer 560 to exit to the front of the display device 1000, the light L that is totally reflected at the interface between the first insulating layer 560 and the second insulating layer 555 to exit to the front of the display device 1000, and the light L refracted at the interface between the second insulating layer 555 and the third insulating layer 550 to exit to the front of the display device 1000.

Next, a manufacturing sequence of the first insulating layer 560, the second insulating layer 555, and the third insulating layer 550 of the display device 1000 will be described with reference to FIGS. 6, 7, 8, and 9.

FIGS. 6, 7, 8, and 9 illustrate process cross-sectional views sequentially showing some of a manufacturing method of a display device 1000 according to an embodiment.

Figure 6:
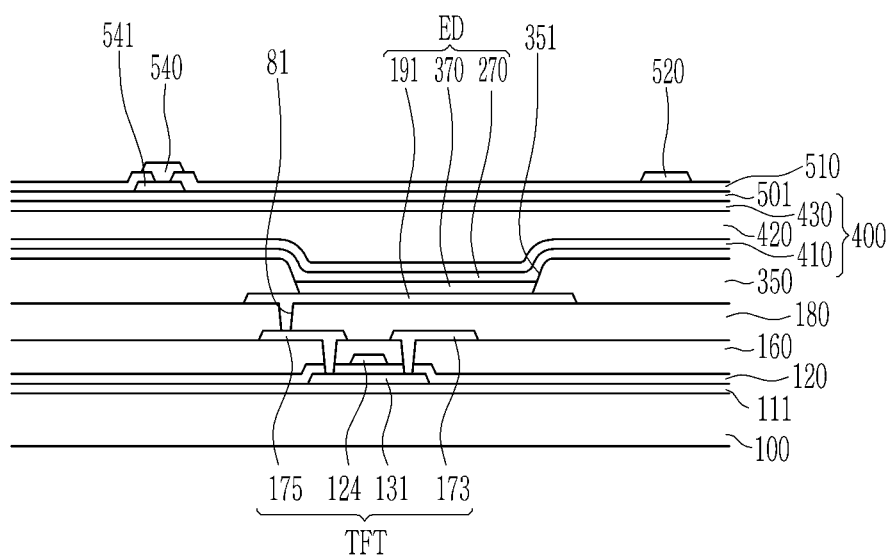
FIGS. 6, 7, 8, and 9 illustrate process cross-sectional views sequentially illustrating an embodiment of a manufacturing method of the display device of FIG. 1 according to the principles of the invention.

First, as illustrated in FIG. 6, a transistor TFT and a light emitting diode ED are formed on the substrate 100, and an encapsulation layer 400 is formed on the transistor TFT and the light emitting diode ED. Further, the second buffer layer 501, the second sensing electrode connector 541, the sensing insulating layer 510, and the sensing electrodes 520 and 540 are formed on the encapsulation layer 400.

Figure 7:
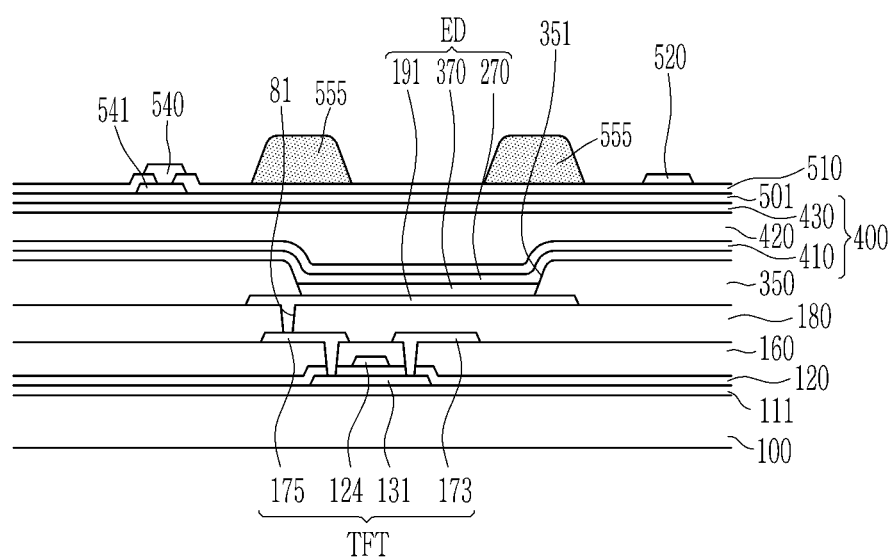

As illustrated in FIG. 7, an organic insulating material is entirely formed on the sensing insulating layer 510 and the sensing electrodes 520 and 540, and the second insulating layer 555 is formed by patterning the organic insulating material. In this case, the second insulating layer 555 may overlap an edge of the pixel opening 351. A side surface of the second insulating layer 555 may have a tapered shape. For example, the side surface of the second insulating layer 555 may have an inclined shape with respect to the sensing insulating layer 510. The width of the second insulating layer 555 may be formed in a range of about 2 μm to about 4 μm in consideration of process tolerances.

Figure 8:
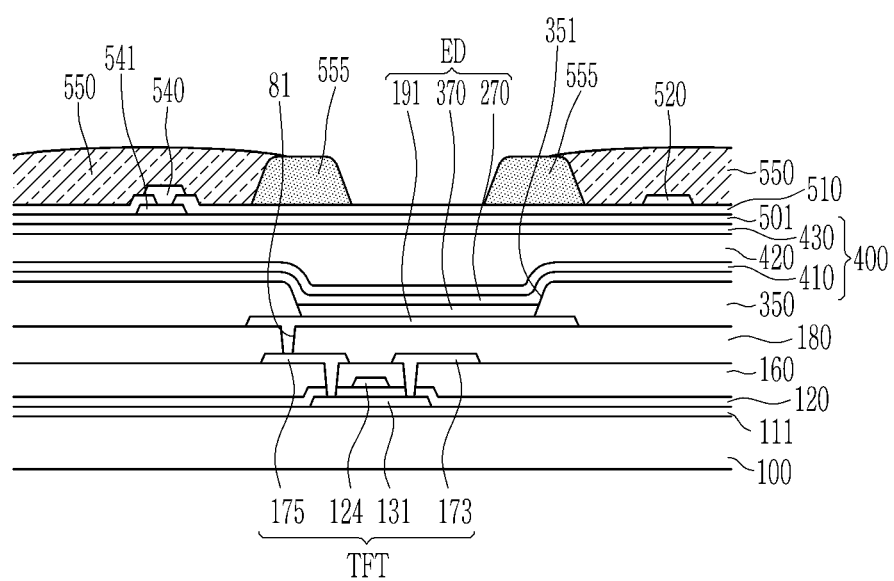

As illustrated in FIG. 8, an organic insulating material is entirely formed on the sensing insulating layer 510, the sensing electrodes 520 and 540, and the second insulating layer 555, and the third insulating layer 550 is formed by patterning the organic insulating material. In this case, the third insulating layer 550 may be positioned outside the second insulating layer 555, and may be formed to surround the second insulating layer 555. During the patterning process, a portion of the organic insulating material positioned on the second insulating layer 555 is removed. In this case, the organic insulating material covering a side surface of the second insulating layer 555 may not be removed. Accordingly, the third insulating layer 550 may be formed to cover an outer surface of the second insulating layer 555. In some cases, the third insulating layer 550 may be formed to cover part or all of the upper surface of the second insulating layer 555. The third insulating layer 550 may be formed to cover the sensing electrodes 520 and 540.

Figure 9:
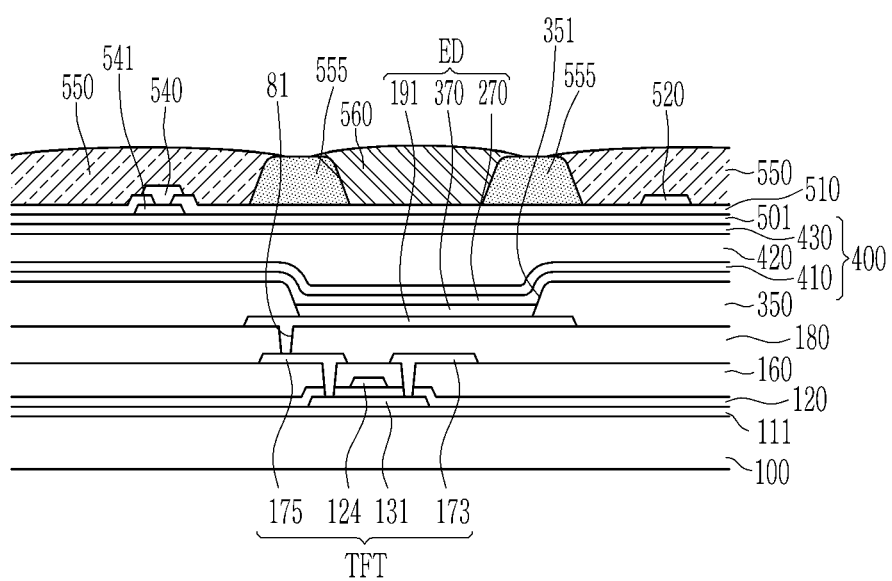

As illustrated in FIG. 9, an organic insulating material is formed entirely on the sensing insulating layer 510, the second insulating layer 555, and the third insulating layer 550, and is patterned to form the first insulating layer 560. In this case, the first insulating layer 560 may be disposed inside the second insulating layer 555. For example, the second insulating layer 555 may be positioned outside the first insulating layer 560, and may be formed to surround the first insulating layer 560. During the patterning process, a portion of the organic insulating material positioned on the second insulating layer 555 and the third insulating layer 550 is removed. In this case, the organic insulating material covering a side surface of the second insulating layer 555 may not be removed. Accordingly, the first insulating layer 560 may be formed to cover an inner surface of the second insulating layer 555. In some cases, the first insulating layer 560 may be formed to cover part or all of the upper surface of the second insulating layer 555. The organic insulating material covering the upper surface of the third insulating layer 550 may be completely removed.

As described above, the second insulating layer 555, the third insulating layer 550, and the first insulating layer 560 may be sequentially formed. For example, the first insulating layer 560 may be formed last among the first insulating layer 560, the second insulating layer 555, and the third insulating layer 550. The first insulating layer 560, the second insulating layer 555, and the third insulating layer 550 may be formed after a plurality of elements are formed on the substrate 100, and the process may be performed at a low temperature such that the elements already formed are not damaged. The first insulating layer 560, the second insulating layer 555, and the third insulating layer 550 may be formed of different materials. Relatively, the material forming the second insulating layer 555 may have stable properties at a low temperature, and the material forming the first insulating layer 560 may have weak properties at a low temperature. In the display device 1000, the first insulating layer 560, the second insulating layer 555, and the third insulating layer 550 may be stably formed by forming the second insulating layer 555 first and forming the first insulating layer 560 last.

However, the process sequence of the first insulating layer 560, the second insulating layer 555, and the third insulating layer 550 is not limited thereto, and may be variously changed or modified. For example, a stable material having a high refractive index may be developed, and accordingly, the first insulating layer 560 may be formed last.

Next, a display device 1001 will be described with reference to FIG. 10.

Figure 10:
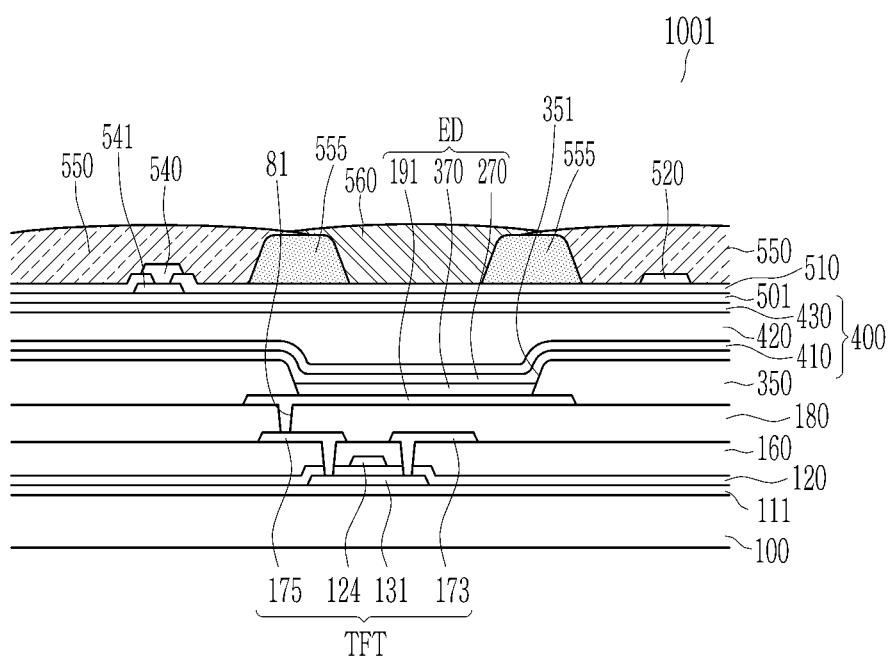
FIG. 10 is a cross-sectional view of another embodiment of a portion of the display device of FIG. 1.

Since the display device 1001 illustrated in FIG. 10 is substantially the same as the display device 1000 shown in FIGS. 1, 2, 3, 4, and 5, description of the same or similar parts will be omitted to avoid redundancy. This embodiment is different from the previous embodiment in that the first insulating layer and the third insulating layer overlap, and will be further described below.

FIG. 10 illustrates a cross-sectional view showing a portion of a display device 1001 according to an embodiment.

As illustrated in FIG. 10, a display device 1001 may include a substrate 100, a transistor TFT positioned on the substrate 100, a light emitting diode ED connected to the transistor TFT, and an encapsulation layer 400 positioned on the light emitting diode ED. The sensing insulating layer 510, a plurality of sensing electrodes 520 and 540, a second sensing electrode connector 541, a first insulating layer 560, a second insulating layer 555, and a third insulating layer 550 may be positioned on the encapsulation layer 400.

In the previous embodiment, the first insulating layer 560 and the third insulating layer 550 may not overlap, while in this embodiment, the first insulating layer 560 and the third insulating layer 550 may overlap.

An edge of the first insulating layer 560 and an edge of the third insulating layer 550 may overlap each other on the second insulating layer 555. The third insulating layer 550 may cover an upper surface of the second insulating layer 555, and the first insulating layer 560 may cover upper surfaces of the second insulating layer 555 and the third insulating layer 550. For example, in an overlapping portion of the first insulating layer 560 and the third insulating layer 550, the first insulating layer 560 may be positioned on the third insulating layer 550. However, embodiments are not limited thereto, and positions of the first insulating layer 560, the second insulating layer 555, and the third insulating layer 550 may be variously changed or modified according to a manufacturing sequence of the first insulating layer 560, the second insulating layer 555, and the third insulating layer 550. The central portion of the overlapping portion of the first insulating layer 560 and the third insulating layer 550 may coincide with the central portion of the second insulating layer 555. However, embodiments are not limited thereto, and the overlapping position of the first insulating layer 560 and the third insulating layer 550 may be variously changed or modified.

Next, a display device 1002 will be described with reference to FIG. 11.

Figure 11:
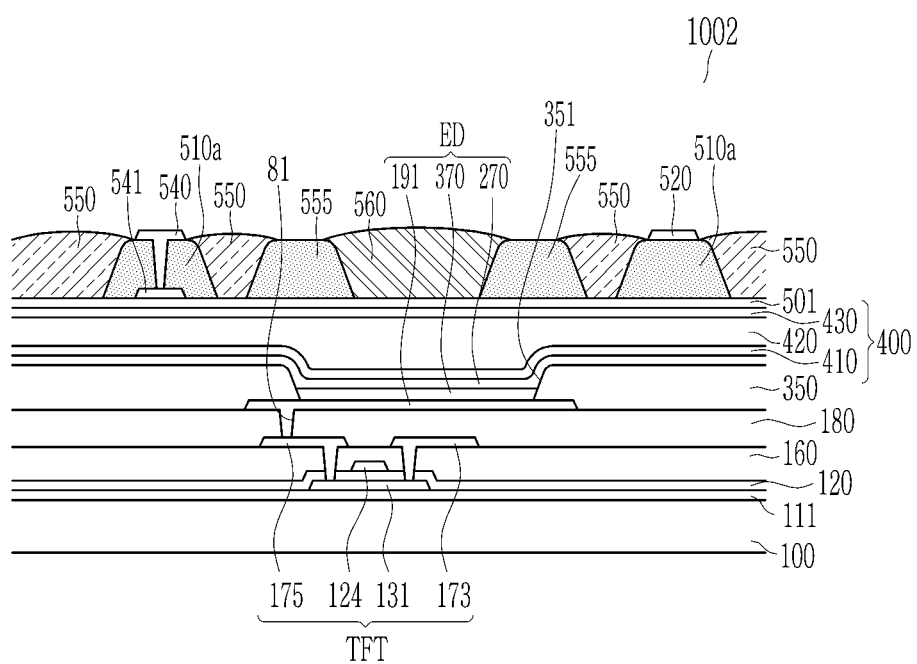
FIG. 11 is a cross-sectional view of another embodiment of a portion of the display device of FIG. 1.

Since the display device 1002 illustrated in FIG. 11 is substantially the same as the display device 1000 shown in FIGS. 1, 2, 3, 4, and 5, description of the same or similar parts will be omitted to avoid redundancy. This embodiment is different from the previous embodiment in that the sensing insulating layer is made of the same material as that of the second insulating layer, and will be further described below.

FIG. 11 illustrates a cross-sectional view showing a portion of a display device 1002 according to an embodiment.

As illustrated in FIG. 11, a display device 1002 may include a substrate 100, a transistor TFT positioned on the substrate 100, a light emitting diode ED connected to the transistor TFT, and an encapsulation layer 400 positioned on the light emitting diode ED. The sensing insulating layer 510, a plurality of sensing electrodes 520 and 540, a second sensing electrode connector 541, a first insulating layer 560, a second insulating layer 555, and a third insulating layer 550 may be positioned on the encapsulation layer 400.

In the embodiments of FIGS. 9 and 10, the first insulating layer 560, the second insulating layer 555, and the third insulating layer 550 may be positioned on the sensing insulating layer, and the third insulating layer 550 may be positioned on the sensing electrodes 520 and 540. In the embodiment of FIG. 11, the sensing insulating layer 510a may be positioned on the same layer as the second insulating layer 555. The sensing insulating layer 510a may be made of the same material as that of the second insulating layer 555. The sensing insulating layer 510a may be formed together in a same process as that of the second insulating layer 555.

In the embodiments of FIGS. 9 and 10, a sensing insulating layer may be formed substantially entirely, while in the embodiment of FIG. 11, the sensing insulating layer 510a may be partially formed. The sensing insulating layer 510a may be positioned at a portion overlapping the sensing electrodes 520 and 540 and the second sensing electrode connector 541. The sensing insulating layer 510a may not overlap the first insulating layer 560 and the second insulating layer 555. A side surface of the sensing insulating layer 510a may be in contact with the third insulating layer 550. The third insulating layer 550 may cover a side surface of the sensing insulating layer 510a. The third insulating layer 550 may be positioned between the second insulating layer 555 and the sensing insulating layer 510a.

The sensing insulating layer 510a may be positioned on the second sensing electrode connector 541, and the sensing electrodes 520 and 540 may be positioned on the sensing insulating layer 510a. The sensing insulating layer 510a may include an opening exposing an upper surface of the second sensing electrode connector 541, and the second sensing electrode connector 541 may be connected to the second sensing electrode 540 through an opening of the sensing insulating layer 510a.

Next, a display device 1003 will be described with reference to FIG. 12.

Figure 12:
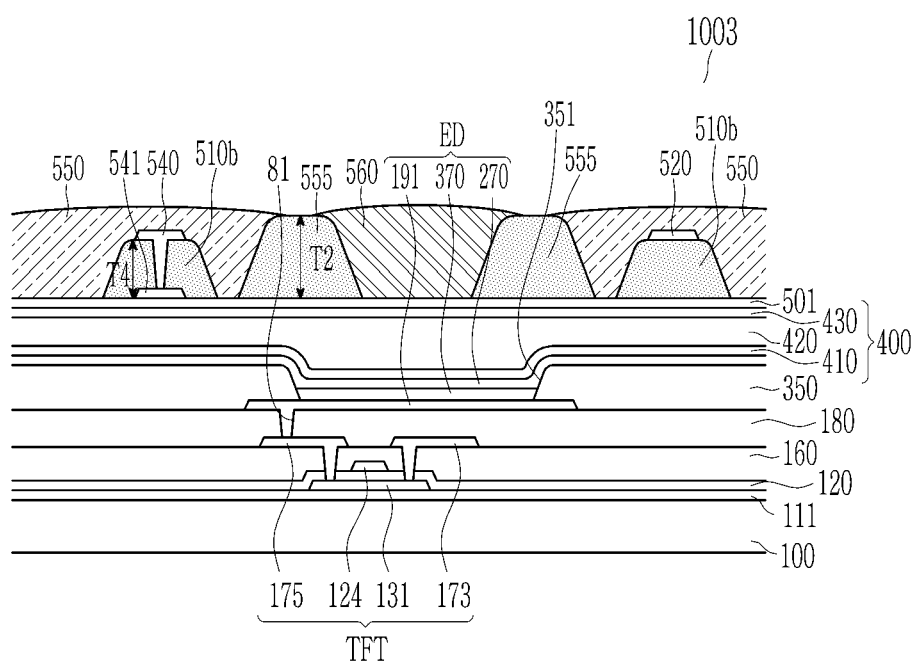
FIG. 12 illustrates a cross-sectional view of yet another embodiment of a portion of the display device of FIG. 1.

Since the display device 1003 illustrated in FIG. 12 is substantially the same as the display device 1002 shown in FIG. 11, a description of the same or similar parts will be omitted to avoid redundancy. The embodiment of FIG. 12 is different from the embodiments of FIGS. 9-11 in that the thickness of the sensing insulating layer is thinner than that of the second insulating layer, and will be further described below.

FIG. 12 illustrates a cross-sectional view showing a portion of a display device 1003 according to an embodiment.

As illustrated in FIG. 12, a display device 1003 may include a substrate 100, a transistor TFT positioned on the substrate 100, a light emitting diode ED connected to the transistor TFT, and an encapsulation layer 400 positioned on the light emitting diode ED. The sensing insulating layer 510, the sensing electrodes 520 and 540, the sensing electrode connector 541, the first insulating layer 560, the second insulating layer 555, and the third insulating layer 550 may be positioned on the encapsulation layer 400.

In the embodiments of FIGS. 9-11, the sensing insulating layer and the second insulating layer 555 may have substantially the same thickness. In the embodiment of FIG. 12, the thickness T4 of the sensing insulating layer 510b may be different from the thickness T2 of the second insulating layer 555.

A sensing insulating layer 510b is made of the same material as that of the second insulating layer 555, and may be positioned on the same layer (e.g., the second buffer layer 501), on which the second insulating layer 555 is positioned. The sensing insulating layer 510b may be formed together in the same process as that of the second insulating layer 555. The sensing insulating layer 510b and the second insulating layer 555 may be formed by using a halftone mask, a slit mask, or the like.

The thickness T4 of the sensing insulating layer 510b may be thinner than the thickness T2 of the second insulating layer 555. For example, the thickness T4 of the sensing insulating layer 510b may be about half (e.g., about 50%) of the thickness T2 of the second insulating layer 555. The third insulating layer 550 may have a similar thickness to that of the second insulating layer 555. Since the thickness T2 of the sensing insulating layer 510b is formed to be relatively thin, the third insulating layer 550 may cover an upper surface of the sensing insulating layer 510b. The sensing insulating layer 510b and the sensing electrodes 520 and 540 may be covered by the third insulating layer 550. Accordingly, the sensing electrodes 520 and 540 may be protected by the third insulating layer 550.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a substrate;
    a transistor disposed on the substrate;
    a pixel electrode connected to the transistor;
    a bank layer disposed on the pixel electrode having a pixel opening overlapping the pixel electrode;
    an emission layer disposed in the pixel opening;
    a common electrode positioned on the emission layer and the bank layer;
    an encapsulation layer disposed on the common electrode;
    a sensing electrode disposed on the encapsulation layer;
    a first insulator disposed on the encapsulation layer to overlap the pixel opening;
    a second insulator disposed outside the first insulator; and
    a third insulator disposed outside the second insulator,
    wherein:
    the first, second, and third insulators are disposed on a same layer, the first insulator has a first refractive index, the second insulator has a second refractive index, and the third insulator has a third refractive index, and wherein the first refractive index, the second refractive index, and the third refractive index are different from each other.

2. The display device of claim 1, wherein
the first refractive index is higher than the second refractive index, and
the second refractive index is higher than the third refractive index.

3. The display device of claim 2, wherein:
the first insulator comprises a first insulating layer,
the second insulator comprises a second insulating layer,
the third insulator comprises a third insulating layer,
the second insulating layer surrounds the first insulating layer,
the third insulating layer surrounds the second insulating layer, and
the second insulating layer is disposed between the first insulating layer and the third insulating layer.

4. The display device of claim 2, wherein the second insulator has a central portion that overlaps an edge of the pixel opening.

5. The display device of claim 2, wherein the first insulator has a size smaller than that of the pixel opening when viewed in plan.

6. The display device of claim 5, wherein the first insulator substantially entirely overlaps the pixel opening.

7. The display device of claim 6, wherein the first insulator does not overlap the bank layer.

8. The display device of claim 2, wherein the third insulator overlaps the bank layer.

9. The display device of claim 8, wherein the third insulator does not overlap the pixel opening.

10. The display device of claim 2, wherein:
the first refractive index is about 1.6 or more and about 1.7 or less,
the second refractive index is about 1.5 or more and about 1.6 or less, and
the third refractive index is about 1.4 or more and about 1.5 or less.

11. The display device of claim 2, wherein each of the first insulator, the second insulator, and of the third insulator have substantially the same thickness.

12. The display device of claim 2, wherein:
the first insulator comprises a first insulating layer,
the second insulator comprises a second insulating layer,
the third insulator comprises a third insulating layer,
the second insulating layer is formed,
the third insulating layer is formed on an outer edge of the second insulating layer, and
the first insulating layer is formed on an inner edge of the second insulating layer.

13. A display device comprising:
a substrate;
a transistor disposed on the substrate;
a pixel electrode connected to the transistor;
a bank layer disposed on the pixel electrode having a pixel opening overlapping the pixel electrode;
an emission layer disposed in the pixel opening;
a common electrode positioned on the emission layer and the bank layer;
an encapsulation layer disposed on the common electrode;
a sensing electrode disposed on the encapsulation layer;
a first insulator disposed on the encapsulation layer to overlap the pixel opening;
a second insulator disposed outside the first insulator; and
a third insulator disposed outside the second insulator,
wherein the first insulator has a first refractive index, the second insulator has a second refractive index, and the third insulator has a third refractive index,
wherein the first refractive index, the second refractive index, and the third refractive index are different from each other,
wherein the first refractive index is higher than the second refractive index and the second refractive index is higher than the third refractive index, and
wherein an edge of the first insulator and an edge of the third insulator overlap each other on the second insulator.

14. The display device of claim 13, wherein the first insulator is disposed on the third insulator in an overlapping portion of the first insulator and the third insulator.

15. A display device comprising:
a substrate;
a transistor disposed on the substrate;
a pixel electrode connected to the transistor;
a bank layer disposed on the pixel electrode having a pixel opening overlapping the pixel electrode;
an emission layer disposed in the pixel opening;
a common electrode positioned on the emission layer and the bank layer;
an encapsulation layer disposed on the common electrode;
a sensing electrode disposed on the encapsulation layer;
a sensing electrode connector connected to the sensing electrode; and
a sensing insulating layer disposed between the sensing electrode and the sensing electrode connector,
a first insulator disposed on the encapsulation layer to overlap the pixel opening;
a second insulator disposed outside the first insulator; and
a third insulator disposed outside the second insulator,
wherein the first insulator has a first refractive index, the second insulator has a second refractive index, and the third insulator has a third refractive index,
wherein the first refractive index, the second refractive index, and the third refractive index are different from each other,
wherein the first refractive index is higher than the second refractive index and the second refractive index is higher than the third refractive index, and
wherein:
the first insulator, the second insulator, the third insulator are disposed on the sensing insulating layer, and
the third insulator is disposed on the sensing electrode.

16. The display device of claim 15, wherein:
the sensing insulator is made of a same material as that of the second insulator, and
the sensing insulating layer and the second insulator are disposed on a same layer.

17. The display device of claim 16, wherein the third insulator is disposed between the second insulator and the sensing insulator.

18. The display device of claim 16, wherein the sensing insulator has a thickness thinner than that of the second insulator.

19. The display device of claim 18, wherein the sensing insulator and the sensing electrode are covered by the third insulator.

* * * * *